(12) United States Patent
Florian et al.

(10) Patent No.: US 8,776,364 B2
(45) Date of Patent: Jul. 15, 2014

(54) METHOD FOR PRODUCING A MULTILAYER CERAMIC COMPONENT

(75) Inventors: Heinz Florian, Bad Gams (AT); Marion Ottlinger, Deutschlandsberg (AT); Peter Sedlmaier, Ruden (AT)

(73) Assignee: EPCOS AG, Munich (DE)

( * ) Notice: Subject to any disclaimer, the term of this patent is extended or adjusted under 35 U.S.C. 154(b) by 962 days.

(21) Appl. No.: 12/415,371

(22) Filed: Mar. 31, 2009

(65) Prior Publication Data

US 2009/0193636 A1    Aug. 6, 2009

Related U.S. Application Data

(62) Division of application No. 10/574,192, filed as application No. PCT/DE2004/002167 on Sep. 29, 2004, now Pat. No. 7,525,241.

(30) Foreign Application Priority Data

Sep. 30, 2003 (DE) .................... 103 45 500

(51) Int. Cl.
*H01L 41/22* (2013.01)
*H04R 17/00* (2006.01)

(52) U.S. Cl.
USPC ............... 29/842; 29/830; 29/846; 29/25.35; 310/311; 367/155; 367/157; 367/180; 331/73; 331/155

(58) Field of Classification Search
USPC ............ 29/25.35, 25.42, 831, 875, 830, 846, 29/842; 106/1.18, 1.23; 310/363–366, 310/311; 361/306.3, 309; 367/155, 157, 367/180; 331/73, 155
See application file for complete search history.

(56) References Cited

U.S. PATENT DOCUMENTS 4,412,904 A    11/1983   Rohr et al.
4,451,869 A *   5/1984   Sakabe et al. ................ 361/309
(Continued)

FOREIGN PATENT DOCUMENTS

DE    199 45 934    3/2001
DE    199 45 933    5/2001
(Continued)

OTHER PUBLICATIONS

Translation of Written Opinion for PCT/DE2004/002167.
(Continued)

*Primary Examiner* — Peter DungBa Vo
*Assistant Examiner* — Jeffery T Carley
(74) *Attorney, Agent, or Firm* — Fish & Richardson P.C.

(57) ABSTRACT

A multilayer ceramic component includes a stack containing ceramic layers and electrode layers interspersed among the ceramic layers. The electrode layers contain copper and define first and second internal electrodes. First and second external contacts are on different sides of the stack. The first and second external contacts contain copper and are substantially perpendicular to the ceramic layers and electrode layers. The first internal electrode is connected to the first external contact and the second internal electrode is connected to the second external contact. The first and second internal electrodes overlap each other at a plane intersecting the stack. In areas adjacent to boundaries between the first and second external contacts and the ceramic layers, the first and second external contacts are not oxidized and material making-up the ceramic layers is not diminished. A bonding strength of the external contacts to the stack exceeds 50 N.

8 Claims, 1 Drawing Sheet

(56) References Cited

U.S. PATENT DOCUMENTS

| | | |
|---|---|---|
| 5,196,757 A | 3/1993 | Omatsu |
| 5,316,698 A * | 5/1994 | Tani et al. ............ 106/1.18 |
| 5,933,315 A | 8/1999 | Yamana |
| 6,230,378 B1 | 5/2001 | Cramer |
| 6,320,738 B1 * | 11/2001 | Yamana et al. ........ 29/25.41 |
| 6,414,417 B1 | 7/2002 | Tsuyoshi et al. |
| 6,606,238 B1 | 8/2003 | Nakamura et al. |
| 6,690,571 B2 | 2/2004 | Shindo et al. |
| 7,525,241 B2 | 4/2009 | Florian et al. |
| 7,855,488 B2 | 12/2010 | Feltz et al. |
| 2002/0053860 A1 | 5/2002 | Mitarai et al. |
| 2002/0098333 A1 | 7/2002 | Feltz et al. |
| 2003/0027432 A1 | 2/2003 | Sumiya et al. |
| 2003/0142463 A1 | 7/2003 | Nakamura et al. |
| 2007/0206341 A1 | 9/2007 | Florian et al. |
| 2012/0180310 A1 | 7/2012 | Florian et al. |

FOREIGN PATENT DOCUMENTS

| | | | |
|---|---|---|---|
| DE | 100 62 672 | 8/2001 | |
| DE | 101 53 770 | 6/2002 | |
| DE | 101 64 354 A1 | 8/2002 | ............ H01B 1/02 |
| DE | 200 23 051 | 2/2003 | |
| DE | 102 35 253 | 4/2004 | |
| EP | 1 167 747 | 1/2002 | ............ F02M 47/02 |
| JP | 64-052672 | 2/1989 | |
| JP | 01-264278 | 10/1989 | |
| JP | 02-205372 | 8/1990 | |
| JP | 5-190375 | 7/1993 | ............ H01G 4/12 |
| JP | 6-232466 | 8/1994 | ............ H01L 41/09 |
| JP | 7-105717 | 4/1995 | ............ H01B 1/02 |
| JP | 07-230714 A | 8/1995 | ............ H01B 1/16 |
| JP | 7-336053 | 12/1995 | ............ H05K 3/46 |
| JP | 9-82134 | 3/1997 | ............ H01B 1/16 |
| JP | 10-133597 | 5/1998 | |
| JP | 11-26296 | 1/1999 | |
| JP | 11-135357 | 5/1999 | |
| JP | 2000-277370 | 10/2000 | ............ H01G 4/12 |
| JP | 2000-299243 | 10/2000 | |
| JP | 2001-69771 | 3/2001 | ............ H02N 2/00 |
| JP | 2002-222705 | 8/2002 | ............ H01C 7/12 |
| JP | 2002-260951 | 9/2002 | ............ H01G 4/12 |
| JP | 2003-59758 | 2/2003 | |
| JP | 2003-178623 | 6/2003 | ............ H01B 1/22 |
| JP | 2003-197991 | 7/2003 | |
| WO | WO 97/40537 | 10/1997 | |
| WO | WO 01/45138 | 6/2001 | |
| WO | WO 02/06184 | 1/2002 | |
| WO | WO 03/069689 | 8/2003 | |
| WO | WO 03/073523 | 9/2003 | |
| WO | WO04/013918 | 2/2004 | |

OTHER PUBLICATIONS

English Translation of Office Action for Japanese Patent Application No. 2006-529619 dated May 25, 2011.

Final Notification of Reasons for Refusal (Type II Office Action) from the Japanese Patent Office for Japanese Patent Application No. 2006-529619 dated Mar. 28, 2012.

English Translation of Board of Appeal's Request for Written Argument for Japanese Patent Application No. 2006-529619, dated Sep. 17, 2013, 5 pages.

English Translation of Office Action for Japanese Patent Application No. 2011-234127, dated Aug. 5, 2013, 5 pages.

https://www.americanpiezo.com/piezo-theory/pzt.html, accessed Jan. 10, 2014, copyright date 2013.

Notification of rejection from corresponding application JP 2011-234127, dated Feb. 3, 2014.

* cited by examiner

METHOD FOR PRODUCING A MULTILAYER CERAMIC COMPONENT

CROSS-REFERENCE TO RELATED APPLICATIONS

This application is a divisional of U.S. application Ser. No. 10/574,192, filed Mar. 28, 2006, now U.S. Pat. No. 7,525,241, which is a national phase application filed under 35 U.S.C. 371 of International Application No. PCT/DE04/002167, filed Sep. 29, 2004, which claims benefit of German Application No. 10345500.0, filed Sep. 30, 2003. The disclosure of the prior applications are considered part of and are incorporated by reference in the disclosure of this application.

TECHNICAL FIELD

This application relates to a multilayer ceramic component and a method for producing the component. The component includes a stack of alternating ceramic layers and copper-containing electrode layers, which serve as internal electrodes. The internal electrodes are connected to external contacts that are arranged on opposite, exterior sides of the stack, perpendicular to the multilayer structure. Internal electrodes that are connected to different external contacts are in interlocking engagement with one another.

BACKGROUND

A component of foregoing type and a method for its production are known, for example, from DE 20023051.4.

DE 9700463 describes a method for producing green films for multilayer piezoceramic components with Ag/Pd internal, in which a PZT-type piezoceramic powder (PZT=lead zirconate titanate) is used.

The material and/or the process used to fire on the external electrodes that contact the internal electrodes should, in principle, be selected such that the electrode metal will not oxidize and the ceramic will not be reduced. For this reason, a precious metal or a precious metal alloy is customarily used as the electrode material.

DE 19945933 describes an exemplary method for producing external electrodes in piezoceramic components comprised of PZT ceramic and Ag/Pd internal electrodes. In this method, contacting of the Ag/Pd internal electrodes is accomplished using a metal paste that has a silver content of >65% and an organic binder, which is fired on at approximately 700° C. The firing on of the metal paste is conducted in an air atmosphere, because aromatic compounds contained in the organic paste binder cannot be completely degraded under reductive conditions. However, this method is not suited to a multilayer component with PZT ceramic and copper-containing internal electrodes, since at customary debindering and/or firing-on temperatures, reduction of the PZT ceramic and oxidation of the metallic copper are prevented under only one specific, very low oxygen partial pressure of <$10^{-2}$ Pa. Thus, the Ag/Pd external electrodes cannot be used in a multilayer ceramic component with copper-containing internal electrodes.

DE 20023051 U1 describes a component that is less costly than multilayer piezoceramic components that are based on a PZT ceramic and Ag/Pd internal electrodes. This component uses copper-containing internal electrodes in place of the expensive Ag/Pd internal electrodes. However, DE 20023051 U1 does not indicate which material would be suitable for firing on external electrodes in a piezoceramic component with copper-containing internal electrodes.

SUMMARY

Described herein is a multilayer ceramic component with internal electrodes and external contacts for contacting the internal electrodes, in which the bonding strength of the external contacts is sufficient. Also described is a method for producing the component, in which the ceramic is not reduced and in which neither internal nor external electrodes will oxidize.

The ceramic component of this application contains a stack of alternating ceramic layers and copper-containing electrode layers that serve as internal electrodes. The internal electrodes are connected to external contacts. The external contacts are arranged on exterior surfaces of the stack, opposite one another and perpendicular to the multilayer structure. The internal electrodes that are connected to different external contacts are in interlocking engagement with one another. The external contacts contain metallic copper. The bonding strength of the external contacts to the stack is at least 50 N.

The ceramic layers may be comprised of ceramic green films that contain a thermohydrolytically degradable binding agent and can comprise a ferroelectric perovskite ceramic of the general composition $ABO_3$, such as one of the PZT type $Pb(Zr_xTi_{1-x})O_3$.

The application further describes a method for producing a ceramic component, in which binder removal, or debindering, is performed and/or completed at a temperature of ≤300° C. The debindering takes place under a nitrogen stream with the addition of water vapor. The water vapor partial pressure is set such that the corresponding oxygen partial pressure at the given temperature is between the equilibrium points for $Cu/Cu_2O$ and $PbTiO_3/Pb$. The equilibrium point corresponds to an oxygen partial pressure at which both a reduced metal and a metal compound that corresponds to this metal are thermodynamically stable and can coexist without diffusing into one another.

Paste binders are completely separated out in a reduced atmosphere of, for example, <$10^{-2}$ Pa at a comparatively low temperature of ≤300° C., because at higher debindering temperatures, the oxygen, which is insufficient to burn off the carbon contained in the organic binder, is partially drawn out of the ceramic lattice structure, which impairs properties of the ceramic layers.

Complete separation of organic constituents occurs because debindering is performed in a nitrogen stream that is charged with water vapor, resulting in hydrolytic separation. The addition of water vapor causes the oxygen partial pressure to decrease thermodynamically. However, the oxygen partial pressure does not drop below a specific level at which the ceramic would begin to reductively degrade.

On the other hand, the oxygen partial pressure also will not exceed a level at which metallic copper would begin to oxidize at the given temperature. Thus the oxygen partial pressure is selected to be low enough so that the reduction processes in the ceramic is adequately inhibited, while at the same time the copper contained in the metal paste will not oxidize.

The oxygen partial pressure is maintained, or correspondingly adjusted, at all times to correspond to the temperature. This occurs not only during the debindering process, but also during firing on of the metal paste, such that in a p(T) diagram it lies between the equilibrium points for $Cu/Cu_2O$ and $Pb/PbO$ at each process temperature.

The proportion of copper in the metal paste may be >70%. Acrylic resin binders may be used as the organic paste binders.

The foregoing makes it possible to use a (copper-containing) metal paste with an organic paste binder to produce external contacts in a piezoceramic component with internal electrodes that contain copper.

To produce the external contacts, a copper-containing metal paste having a copper content of >70 m %, for example 78 m %, a glass flow, and an organic binder, for example acrylic resin binder, may be used.

Glass flow (glass frit) may be comprised essentially of PbO and $SiO_2$, but may also contain other components, such as $Na_2O$, $Al_2O_3$ and BaO. The proportion of glass flow in the metal paste may be less than 5 m %. The composition and the proportion of the glass flow are selected such that the glass frit contained in the metal paste of the external contacts partially diffuses into the ceramic, thereby increasing the bonding strength of the external contacts to the sides of the stack.

First, using a known process produces a stack comprised of layers of ceramic material and electrode layers placed one on top of another, which in a finished component correspond to the internal electrodes. The electrode layers are comprised of a copper-containing metal paste and can be applied to the layers made of a ceramic material, for example, via screen printing.

The copper-containing metal paste is also applied, for example, via screen printing, on opposite sides of the stack of internal electrodes and ceramic layers, which are positioned one on top of another.

The binder is removed from the metal paste in a moist nitrogen atmosphere in a gas-tight furnace at a temperature of ≤300° C., after which it is sintered at a higher temperature.

The copper-containing metal paste may be fired on at between 700 and 860° C.

To prevent the reduction of the lead oxide contained in the ceramic, lattice bases made of metallic copper, which serve simultaneously as gettering material, can be used in production of a component described herein.

Below, the component, and method for its production, are described in greater detail with reference to exemplary embodiments and the associated drawings. The figures contain schematic, not-to-scale representations of various exemplary embodiments. Identical or equivalent components are assigned the same reference figures.

DETAILED DESCRIPTION

Figure 1:
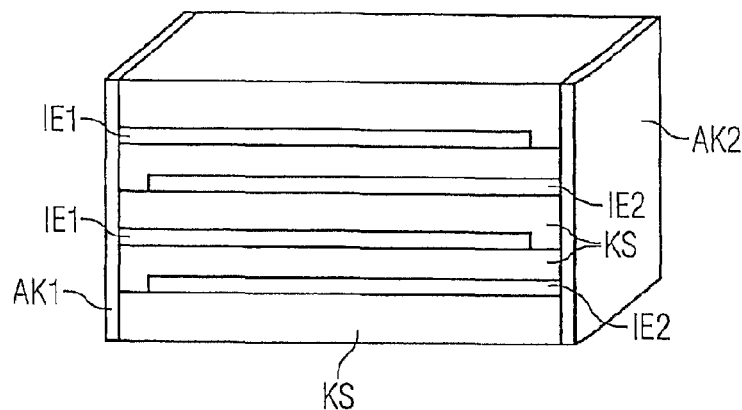
FIG. 1 is a perspective view of the structural design of a ceramic multilayer component.

FIG. 1 shows a ceramic component with copper-containing external contacts AK1 and AK2. First copper-containing internal electrodes IE1 are connected to the first external contact AK1. Second copper-containing internal electrodes IE2 are connected to the second external contact AK2. The internal electrodes are separated from one another by ceramic layers KS.

The ceramic layers KS may possess piezoelectric properties and may be produced using the PZT-type ceramic.

The component of FIG. 1 is a piezoelectric actuator. The electrode layers and ceramic layers stacked one on top of another are referred to herein as a piezo stack.

The fired-on external contacts AK1, AK2 may be between 10 and 20 μm thick, e.g., 15 μm, thick. However, a different thickness for the external contacts may also be used.

The external contacts and/or internal electrodes may contain a certain proportion of ceramic, which may be less than 50 m % (m %—percentage by mass), and which in one embodiment is between 10 and 50 m %, e.g., 40 m %. In this embodiment, the ceramic proportion comprises ceramic particles having a specific grain size, for example, an average grain size of between 0.2 and 0.6 μm.

The ceramic portion in the metal paste serves to inhibit the formation of cracks and separation of the external contact from the piezo stack, which can result from different expansion properties of the ceramic material and metallic copper.

The thermal expansion coefficient of PZT-type ceramic within the temperature range extending from room temperature to the Curie temperature is approximately 1.5-2.0 ppm/K. In the same temperature range, metallic copper has a substantially higher thermal expansion coefficient of approximately 19 ppm/K. By admixing the ceramic material into the metal paste, the expansion characteristics of the external contact are adjusted to the expansion behavior of the ceramic stack both for the processing of the component and for its later applications within the specified temperature range of, for example, −50° C. to +150° C., wherein, for example, the application of an electrical field causes a deformation of the component.

To adjust the thermal expansion coefficient, a glass frit that contains a high proportion of $SiO_2$, for example 39 m %, may be used, since $SiO_2$ has a high affinity for PZT-type ceramic.

In preparation of the copper-containing metal paste, first a ceramic powder having an average grain size of, for example, 0.4 μm is dispersed in a solvent. The ceramic powder dispersion is then stirred into the copper-containing metal paste of the above-named composition, and is homogenized using a three-roller drawing machine. The viscosity of the metal paste may be between 10 and 20 Pas. Once the finished metal paste has been applied to the side surfaces of the piezo stack, the paste is dried at approximately 80 to 140° C. in an air atmosphere. This is followed by debindering and sintering under the foregoing specified conditions, in which oxidation of metallic copper and reduction of PbO or $PbTiO_3$ are prevented. In this embodiment, selection of the debindering temperature and the duration of the debindering process ensures that, during debindering, both the binder components and the residual solvent will be completely burned out of the metal paste.

Because the glass frit contained in the metal paste can diffuse quite extensively into the ceramic, leaving behind hollow cavities in the sintered ceramic layers, the sinter temperature is selected to be low enough (for example, 765° C.) that the glass additive can penetrate only in the area of the internal electrodes. Microscopic studies have shown that at such a sinter temperature glass portions, above all silicon oxide, can be detected within a narrow area of the ceramic layers that is adjacent to the external contacts. The external contacts adhere firmly and can be detached from the piezo stack with the application of a high level of force, greater than 50 N. With the forceful detachment of the external contacts, portions of the ceramic material are broken off, which indicates a high level of bonding strength for the external contacts on the piezo stack.

The ceramic proportion may be 40 m % relative to the solids content of the metal paste. This metal paste can also be used for internal electrode layers.

A chemically active ceramic powder (or even some other chemically active additive), hereinafter also referred to as a ceramic additive, may be present in the electrode metallization, which under certain circumstances can react chemically with the electrode metal, the organic binder, the ceramic, and/or a reaction product of the latter, or can chemically bind certain components. Furthermore, the ceramic additive can react with the process atmosphere, for example, it can release oxygen into the process atmosphere or can absorb oxygen so that the oxygen partial pressure is stabilized at least locally or temporarily. With a stable oxygen partial pressure, it is possible to protect internal electrode layers or external contacts from oxidation and to protect ceramic layers from reduction. The ceramic powder additive ensures that a metal oxide that has been formed as a result of process instabilities in the electrode metallization is bonded, thus preventing an undesirable diffusion of this metal oxide into the ceramic layers.

The process of using a chemically inert ceramic powder in a metal paste, for example, to retard the sintering of the metal, is known in the art. In this application, however, the ceramic powder is used as a functional additive that is chemically active and can chemically react with its environment. The chemical activity can be focused, for example, on binding of Pb, which is released from the lead-containing ceramic material during sintering. It is also possible for the chemically active ceramic powder to bind another component from the ceramic mass especially during sintering, or to promote the release of certain components, such as oxygen from the ceramic mass or from the binder contained in the ceramic mass or in the metal paste. The ceramic powder should not chemically react with the metal portion of the metal paste.

In contrast to the metal paste that is used for the external electrodes, in the metal paste that is suitable for use in the internal electrode layers, preferably no glass additives are used. $(Zr,Ti)O_2$ is particularly well suited for use as the chemically active ceramic powder. In place of a chemically active ceramic powder, the metal paste can also contain another chemically active additive, or in addition to the chemically active ceramic powder it may contain portions of other substances, for example $BaO_2$ and/or $MgO$.

The addition of a ceramic powder in the case of the internal electrodes further serves to improve adhesion between the internal electrodes and the ceramic layers that surround them. A fine distribution of the ceramic particles among the metal particles especially serves to prevent sinter neck formation. The sinter necks represent a localized disconnection of the internal electrodes, in which the metal coating becomes detached from the ceramic layer and/or becomes pulled back—especially around the edges—so that the internal electrodes assume a net-like structure, which is not replicable from component to component. The method of achieving a homogeneous internal electrode structure by adding a precious metal or a precious metal alloy is known in the art. However, the addition of the ceramic powder as described herein also provides a substantial cost advantage over the known method.

Figure 2:
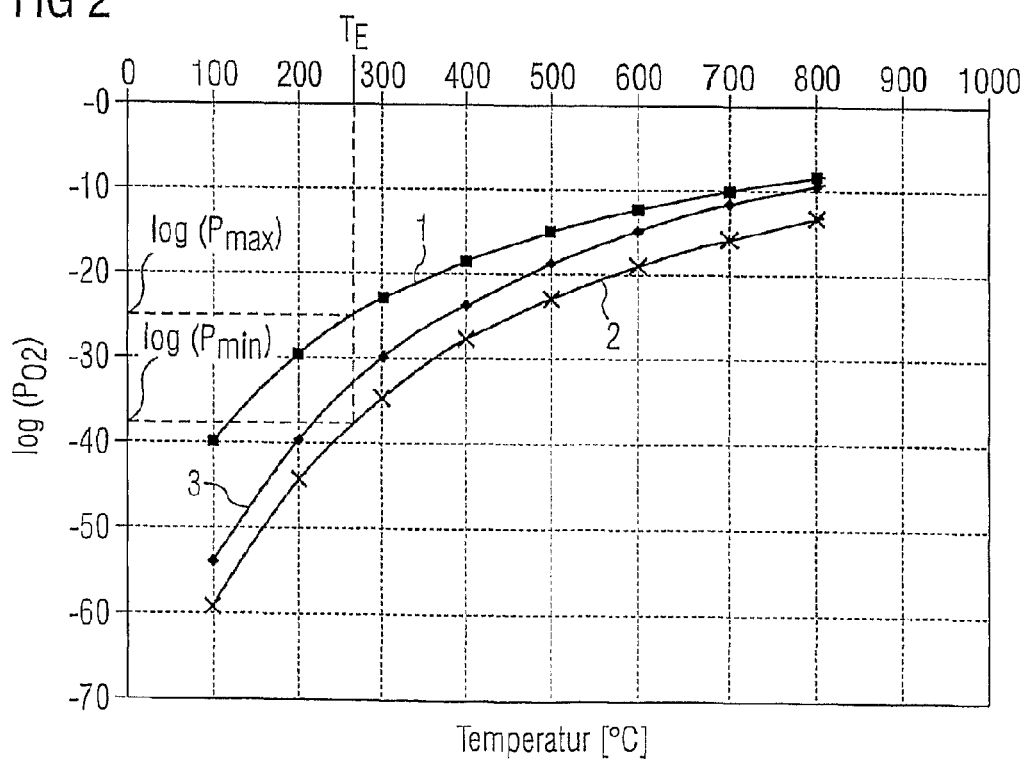
FIG. 2 is a half-logarithmic representation of oxygen partial pressure, which can be adjusted via the addition of water vapor, as a function of the temperature and the equilibrium curves for $Cu/Cu_2O$ and $Pb/PbTiO_3$.

FIG. 2 shows a half-logarithmic representation of an oxygen partial pressure $p_{O2}$ that can be adjusted based upon the temperature—by adding water vapor—and is illustrated by way of example by the curve 3, the numerically calculated equilibrium curve 1 for Cu and $Cu_2O$, and the numerically calculated equilibrium curve 2 for Pb and $PbTiO_3$.

The equilibrium curve 1 indicates the partial pressure of $O_2$ at the selected temperature, at which metallic Cu and $Cu_2O$ can coexist. Metallic copper exists only at an oxygen partial pressure $p_{O2}$ that does not exceed the equilibrium level, i.e. below the equilibrium curve 1. Because only $Cu_2O$ is stable above the curve 1, at an oxygen partial pressure that exceeds the equilibrium value at the selected temperature an undesirable oxidation of the metallic copper will occur.

The equilibrium curve 2 indicates the partial pressure for $O_2$ at the selected temperature, at which metallic Pb and $PbTiO_3$ can coexist. $PbTiO_3$ exists only above the curve 2. At an oxygen partial pressure $p_{O2}$ that drops below the equilibrium level at the selected temperature, the $PbTiO_3$ contained in the ceramic will be reduced to Pb.

For this reason, at least during the debindering phase of a process for producing the above-described multilayer ceramic component, the oxygen partial pressure $p_{O2}$ is adjusted by adding water vapor such that the oxygen partial pressure does not exceed the maximum level $p_{max}$ as defined by the curve 1, at which metallic copper is still stable, but also will not drop below the minimum level $p_{min}$ as indicated by the curve 2, at which lead titanate is not yet reduced, i.e., $p_{min} < p_{O2} < p_{max}$ at the given debindering temperature $T_E$. The permissible range for adjustment of the oxygen partial pressure is between the curves 1 and 2.

Curve 3 shows an optimal oxygen partial pressure to be established based upon temperature and within a moist atmosphere. The quantity of water vapor to be added can be calculated in principle from the curve 3. It is also possible to manually or automatically control the drop in the oxygen partial pressure by adding water vapor, in such a way that the preset threshold values are not exceeded.

What is claimed is:

1. A method for producing a multilayer ceramic component, the multilayer ceramic component comprising a stack comprising ceramic layers and electrode layers interspersed among the ceramic layers, the electrode layers containing copper, the electrode layers comprising first and second internal electrodes, the method comprising:

applying first and second external contacts to different sides of the stack, the first and second external contacts containing copper, the first and second external contacts being substantially perpendicular to the ceramic layers and electrode layers, wherein applying comprises debindering and sintering metal paste to form the first and second external contacts;

wherein debindering is performed at a temperature of less than or equal to 300° C. in a nitrogen stream with water vapor;

wherein, at least during debindering, an oxygen partial pressure does not drop below a level of $p_{min}$, at which ceramic contained in the ceramic layers begins to degrade;

wherein the oxygen partial pressure does not exceed a level of $p_{max}$, at which metallic copper will begin to oxidize;

wherein the first internal electrode is connected to the first external contact and the second internal electrode is connected to the second external contact, the first and second internal electrodes overlapping each other at a plane intersecting the stack, wherein in areas adjacent to boundaries between the first and second external contacts and the ceramic layers, the first and second external contacts are not oxidized and material comprising the ceramic layers is not diminished, and wherein a bonding strength of the external contacts to the stack exceeds 50N.

2. The method of claim 1,
wherein $p_{min}$ corresponds to an equilibrium point for Cu/Cu$_2$O; and
wherein $p_{max}$ corresponds to an equilibrium point for Pb/PbO or Pb/PbTiO$_3$.

3. The method of claim 1, wherein the metal paste contains copper at greater than 70 m % (percentage by mass); and
wherein applying comprises using a glass flow and an organic binder.

4. The method of claim 3, wherein the organic binder comprises an acrylic resin binder.

5. The method according to claim 3, wherein the glass flow contains PbO and SiO$_2$.

6. The method of claim 3, wherein applying further comprises firing the metal paste at a temperature between 700 and 860° C.

7. The method of claim 6, wherein debindering and firing the metal paste are performed using a copper base layer.

8. The method of claim 3, wherein the metal paste is applied via a screen printing process.

* * * * *

UNITED STATES PATENT AND TRADEMARK OFFICE
CERTIFICATE OF CORRECTION

| | | |
|---|---|---|
| PATENT NO. | : 8,776,364 B2 | Page 1 of 1 |
| APPLICATION NO. | : 12/415371 | |
| DATED | : July 15, 2014 | |
| INVENTOR(S) | : Heinz Florian, Marion Ottlinger and Peter Sedlmaier | |

It is certified that error appears in the above-identified patent and that said Letters Patent is hereby corrected as shown below:

In the Specification

Column 1, Line 8:

Delete "Mar. 28, 2006," and Insert -- May 11, 2007 --

Signed and Sealed this
Twenty-eighth Day of October, 2014

Michelle K. Lee
*Deputy Director of the United States Patent and Trademark Office*